United States Patent
Jeon et al.

(10) Patent No.: US 9,500,788 B2
(45) Date of Patent: Nov. 22, 2016

(54) POLARIZING PLATE COMPRISING A POLARIZER AND A RETARDATION LAYER

(71) Applicant: LG CHEM, LTD., Seoul (KR)

(72) Inventors: Byoung Kun Jeon, Daejeon (KR); Moon Soo Park, Daejeon (KR); Hyuk Yoon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/305,960

(22) Filed: Jun. 16, 2014

(65) Prior Publication Data

US 2014/0307317 A1 Oct. 16, 2014

Related U.S. Application Data

(63) Continuation of application No. PCT/KR2012/011100, filed on Dec. 18, 2012.

(30) Foreign Application Priority Data

Dec. 19, 2011 (KR) .................. 10-2011-0137172
Dec. 18, 2012 (KR) .................. 10-2012-0148912

(51) Int. Cl.
*G02B 5/30* (2006.01)
*G02B 27/28* (2006.01)

(52) U.S. Cl.
CPC .................. *G02B 5/3025* (2013.01)

(58) Field of Classification Search
CPC .. G02B 5/3083; G02B 27/286; G02B 27/26; G02B 5/3025; G02B 1/11; G02B 27/28; G02B 5/32; G02B 1/08; G02B 1/105; G02B 5/30; G02B 2006/12116; G02B 5/003

USPC .......... 359/485.01, 485.03, 485.07, 489.01, 359/489.07, 489.08, 489.11, 489.02, 359/489.12, 489.06

See application file for complete search history.

(56) References Cited

U.S. PATENT DOCUMENTS

| | | | |
|---|---|---|---|
| 5,859,681 A * | 1/1999 | VanderPloeg et al. ....... | 349/120 |
| 7,106,397 B1 * | 9/2006 | Kawamoto .......... | G02B 5/3016 |
| | | | 348/117 |
| 7,948,591 B2 * | 5/2011 | Sakai .................. | G02B 5/3083 |
| | | | 349/117 |
| 7,982,826 B2 * | 7/2011 | Hirakata et al. ............... | 349/85 |
| 2007/0242188 A1 * | 10/2007 | Sakai .............................. | 349/96 |
| 2010/0231830 A1 * | 9/2010 | Hirakata ............... | G02B 1/105 |
| | | | 349/85 |
| 2011/0063547 A1 * | 3/2011 | Takahashi ............ | G02B 5/3016 |
| | | | 349/98 |

FOREIGN PATENT DOCUMENTS

| | | |
|---|---|---|
| CN | 1777834 A | 5/2006 |
| CN | 101103305 A | 1/2008 |
| CN | 101762903 A | 6/2010 |
| CN | 101852950 A | 10/2010 |
| JP | 08-321381 A | 12/1996 |
| JP | 2007-256589 | 10/2007 |
| JP | 2008-197224 A | 8/2008 |

(Continued)

*Primary Examiner* — Scott J Sugarman
*Assistant Examiner* — Mustak Choudhury
(74) *Attorney, Agent, or Firm* — Dentons US LLP

(57) ABSTRACT

Provided are a polarizing plate and a display. The illustrative polarizing plate may exhibit desired characteristics in a wide range of wavelengths, and have excellent reflection and visibility at an inclined angle. For example, the polarizing plate may be used in a reflective or transflective liquid crystal display or an organic light emitting device.

9 Claims, 13 Drawing Sheets

(56) References Cited

FOREIGN PATENT DOCUMENTS

| | | |
|---|---|---|
| JP | 2009-300760 | 12/2009 |
| JP | 2010-211230 | 9/2010 |
| KR | 10-0601920 B1 | 7/2006 |
| KR | 10-0677050 B1 | 1/2007 |
| KR | 10-2008-0059832 A | 7/2008 |
| KR | 10-2010-0071459 A | 6/2010 |
| KR | 10-2010-0073783 A | 7/2010 |
| WO | 2008-059721 A1 | 5/2008 |
| WO | 2010-058633 A1 | 5/2010 |

* cited by examiner (a)      (b)      (c)

(d)      (e)      (f)

(a) (b) (c)

(d) (e)

(a) (b) (c)

(d) (e) (f) (g)

(a)   (b)   (c)

(d)   (e)   (f)

(a)　　　(b)　　　(c)

(d)　　　(e)　　　(f)

(a)　　　(b)　　　(c)

(d)　　　(e)　　　(f)

(a)     (b)     (c)

(d)     (e)     (f)

POLARIZING PLATE COMPRISING A POLARIZER AND A RETARDATION LAYER

This application is a Bypass Continuation Application of International Application No. PCT/KR2012/011100, filed Dec. 18, 2012, and claims priority to Korean Application Nos. 10-2011-0137172 filed Dec. 19, 2011 and 10-2012-0148912 filed Dec. 18, 2012, all of which are hereby incorporated by reference in its entirety.

TECHNICAL FIELD

The present application relates to a polarizing plate and a display.

BACKGROUND

A polarizing plate having a structure in which a polarizer and a retardation film are stacked may be used to prevent reflection of external light or ensure visibility in a display, for example, a liquid crystal display or an organic light emitting device.

Here, a retardation film is a ½ or ¼ wavelength retardation film depending on retardation characteristics. The ½ or ¼ wavelength retardation films which have been known so far exhibit retardation differences according to wavelengths, and therefore are operated in a limited range of wavelengths. For example, in many cases, a film serving as a ¼ wavelength retardation film with respect to light having a wavelength of 550 nm may not be operated with respect to light having a wavelength of 450 or 650 nm.

PRIOR ART DOCUMENT

Patent Document

Patent Document 1: Japanese Patent Publ. No. 1996-321381

DESCRIPTION

Technical Object

The present application provides a polarizing plate and a display.

Technical Solution

One illustrative polarizing plate may include a polarizer and a retardation layer. The retardation layer may be stacked on one side of the polarizer. FIG. 1 shows a polarizing plate including a polarizer 101 and a retardation layer 102. The retardation layer may include a uniaxial retardation film or biaxial retardation film. The retardation layer may have a monolayer or multilayer structure.

The term "polarizer" used herein refers to an object distinguished from a polarizing plate. The term "polarizer" refers to a film, sheet or element having a polarizing function, and the term "polarizing plate" refers to an object including the polarizer and other components stacked on one or both surfaces of the polarizer. Here, other components may include, but are not limited to, a retardation layer and a polarizer protective film.

The term "uniaxial retardation film" used herein refers to a layer, film, sheet or element in which two of a refractive index in the x axis direction (hereinafter, Nx), a refractive index in the x axis direction (hereinafter, Ny) and a refractive index in the x axis direction (hereinafter, Nz) are the same, but the other refractive index is different. The term "the same" used herein means substantially the same, and includes errors or deviations generated in a manufacturing process. Here, as shown in FIG. 2, the x axis refers to any one of in-plane directions of a film 100, the y axis refers to any one of in-plane directions of the film 100 vertical to the x axis, and the z axis refers to a normal direction of a plane formed by the x and y axes, that is, a thickness direction of the retardation film 100. In one example, the x axis may be a direction parallel to a slow axis of the retardation film, and the y axis may be a direction parallel to a fast axis of the retardation film. Unless particularly defined otherwise, the term "refractive index" used herein is a refractive index with respect to light having a wavelength of approximately 550 nm.

In the specification, one of the uniaxial retardation films satisfying Formula 1 is defined as a positive uniaxial retardation film, and one satisfying Formula 2 is defined as a C plate.

$$Nx \neq Ny = Nz \quad \text{[Formula 1]}$$

$$Nx = Ny \neq Nz \quad \text{[Formula 2]}$$

The term "biaxial retardation film" used herein may refer to a layer, film, sheet or element having different refractive indexes in Nx, Ny and Nz directions. One of the biaxial retardation films satisfying Formula 3 may be defined as a positive biaxial retardation film, and one satisfying Formula 4 may be defined as a negative biaxial retardation film.

$$Nx \neq Ny < Nz \quad \text{[Formula 3]}$$

$$Nx \neq Ny > Nz \quad \text{[Formula 4]}$$

In the specification, in-plane retardation (Rin) of a retardation layer or retardation film is calculated by Formula 5, and a thickness-direction retardation (Rth) is calculated by Formula 6.

$$Rin = d \times (Nx - Ny) \quad \text{[Formula 5]}$$

$$Rth = d \times (Nz - Ny) \quad \text{[Formula 6]}$$

In Formulas 5 and 6, Rin is in-plane retardation, Rth is a thickness-direction retardation, d is a thickness of a retardation layer or retardation film, and Nx, Ny and Nz are refractive indexes in x, y and z axes defined as described above, respectively.

The term "tilt angle" used herein refers to an angle between a normal line of a surface of a polarizing plate, a retardation layer or a retardation film and an observation direction, and the term "radial angle" used herein refers to an angle between projection of the observation direction to the surface and a predetermined direction on the surface. For example, in FIG. 3, when a plane (xy plane) formed by the x and y axes is a surface of the polarizing plate, retardation layer or retardation film, the inclined angle is an angle (θ of FIG. 3) formed by the normal line of the xy plane, that is, the z axis of FIG. 3, and the observation direction (P). In addition, the radial angle may refer to an angle (φ of FIG. 3) formed by the x axis and projection of the observation axis (P) to the xy plane.

The polarizer is a functional element capable of extracting light vibrating in one direction from incident light vibrating in various directions. As the polarizer, a known linear absorbing polarizer may be used. As the polarizer, a poly (vinyl alcohol) (PVA) polarizer may be used. In one example, the polarizer included in the polarizing plate may be a PVA film or sheet in which a dichroic pigment or iodine is adsorbed and oriented. The PVA may be obtained by gelating polyvinylacetate. The polyvinylacetate may be a homopolymer of vinyl acetate, and a copolymer of vinyl acetate and another monomer. Another monomer copolymerized with vinyl acetate may be one or at least two of an unsaturated carboxylic acid compound, an olefin compound, a vinyl ether compound, an unsaturated sulfonic acid compound, and an acrylamide compound having an ammonium group. Generally, a degree of gelation of polyvinylacetate may be approximately 85 to 100 mol % or 98 to 100 mol %. Generally, a degree of polymerization of PVA of a linear polarizer may be approximately 1,000 to 10,000 or 1,500 to 5,000.

The retardation layer included in the polarizing plate may have a thickness-direction retardation of more than 0 nm to 300 nm. When the retardation layer has a multilayer structure including at least two retardation films, and all of the at least two retardation films in the multilayered retardation layer have a thickness-direction retardation, the thickness-direction retardation may be the sum of the thickness-direction retardation of the retardation films. In another example, the upper limit of the thickness-direction retardation of the retardation layer may be 270, 250, 240, 230, 220, 200, 190, 180, 170, 160, 155, 150, 130, 120, 110, 100, 80 or 70 nm. In still another example, the lower limit of the thickness-direction retardation of the retardation layer may be 5 nm, 10 nm, 20 nm, 40 nm, 50 nm, 90 nm, 100 nm, 110 nm, 120 nm or 150 nm. As the thickness-direction retardation in the polarizing plate is controlled as described above, the polarizing plate may have excellent reflection and visibility, and particularly, excellent reflection and visibility at an inclined angle.

Accordingly, the polarizing plate may have a reflectivity measured at an inclined angle of 50 degrees of 12, 10, 8, 6 or 5% or less. The reflectivity may be reflectivity with respect to light having any one wavelength in a visible light region, for example, light having any one wavelength in the range of 380 to 700 nm, or light included in the entire wavelengths of visible light. The reflectivity may be, for example, reflectivity measured on a side of the polarizer of the polarizing plate. The reflectivity is reflectivity measured at a specific radial angle at an inclined angle of 50 degrees or a radial angle in a predetermined range, or a strength measured with respect to all radial angles at the inclined angle of 50 degrees, and a value measured by a method to be described in the following Example.

The retardation layer included in the polarizing plate may have in-plane retardation in the range capable of exhibiting a ¼ wavelength retardation characteristic. The term "n wavelength retardation characteristic" used herein may refer to a characteristic that incident light can be retarded n times a wavelength of the incident light in at least a part of a wavelength range. In one example, the retardation layer may have in-plane retardation with respect to light having a wavelength of 550 nm of approximately 100 to 250 nm, 100 to 220 nm, 100 to 200 nm or 140 to 170 nm. When the retardation layer has a multilayer structure including at least two retardation films, and all of the at least two retardation films have a thickness-direction retardation in the multilayered retardation layer, the in-plane retardation of the retardation layer may be the sum of in-plane retardation of all retardation films.

In one example, the retardation layer may satisfy Formula 7.

$$R(450)/R(550) < R(650)/R(500)$$ [Formula 7]

In Formula 7, R(450) is in-plane retardation of the retardation layer with respect to light having a wavelength of 450 nm, R(550) is in-plane retardation of the retardation layer with respect to light having a wavelength of 550 nm, and R(650) is in-plane retardation of the retardation layer with respect to light having a wavelength of 650 nm. When the retardation layer has a multilayer structure including at least two retardation films, and in the multilayered retardation layer, all of the at least two retardation films have in-plane retardation, the in-plane retardation of the retardation layer may be the sum of in-plane retardation of all retardation films.

The retardation layer satisfying Formula 7 may be a retardation layer satisfying a reverse wavelength dispersion characteristic, and the retardation may exhibit a retardation characteristic designed in a wide range of wavelengths. For example, the retardation layer may have R(450)/R(550) of Formula 8 of 0.81 to 0.99, 0.82 to 0.98, 0.83 to 0.97, 0.84 to 0.96, 0.85 to 0.95, 0.86 to 0.94, 0.87 to 0.93, 0.88 to 0.92 or 0.89 to 0.91, and R(650)/R(550) of Formula 8, which has a larger value than the R(450)/R(550), of 1.01 to 1.19, 1.02 to 1.18, 1.03 to 1.17, 1.04 to 1.16, 1.05 to 1.15, 1.06 to 1.14, 1.07 to 1.13, 1.08 to 1.12 or 1.09 to 1.11. To make the retardation layer satisfy Formula 8, the retardation layer may be formed using a retardation film to be described below, but the present application is not limited thereto.

In one example, the retardation layer may include a positive uniaxial retardation film and a C plate. That is, the retardation layer may be a film in which the positive uniaxial retardation film and the C plate are stacked. When the retardation layer includes the positive uniaxial retardation film and the C plate, for example, as shown in FIG. 4, in a polarizing plate, a C plate 1021 may be disposed closer to an absorbing polarizer 101 than a positive uniaxial retardation film 1022, or as shown in FIG. 5, a positive uniaxial retardation film 1022 may be disposed closer to a polarizer 101 than a C plate 1021.

In the structure shown in FIG. 4, an angle between a slow axis of the positive uniaxial retardation film and a light absorbing axis of the absorbing polarizer may be, for example, approximately 30 to 60 or 40 to 50 degrees, or approximately 45 degrees. In this arrangement, the polarizing plate may exhibit suitable performance. In the structure shown in FIG. 4, a thickness-direction retardation of the C plate may be in the same range as the thickness-direction retardation of the retardation layer described above, for example, approximately 0 to 200 nm or more than 0 to 200 nm. In addition, in the structure of FIG. 4, in-plane retardation of the positive uniaxial retardation film may be in the same range as the in-plane retardation of the retardation layer described above.

In the structure shown in FIG. 5, an angle between a slow axis of the positive uniaxial retardation film and a light absorbing axis of the absorbing polarizer may be, for example, approximately 30 to 60 or 40 to 50 degrees, or approximately 45 degrees. In this arrangement, the polarizing plate may exhibit suitable performance. In the structure shown in FIG. 5, a thickness-direction retardation of the C plate may be in the same range as the thickness-direction retardation of the retardation layer described above, for example, approximately 0 to 200 nm or more than 0 to 200 nm. In addition, in the structure of FIG. 5, in-plane retardation of the positive uniaxial retardation film may be in the same range as the in-plane retardation of the retardation layer described above.

In another example, the retardation layer may include a positive biaxial retardation film. When the positive biaxial retardation film is included, the retardation layer may have a monolayer structure including the film, or a multilayer structure including the positive biaxial retardation film and another retardation film.

In the monolayer structure of the positive biaxial retardation film, an angle between a slow axis of the positive biaxial retardation film and a light absorption axis of an absorbing polarizer may be approximately 30 to 60 or 40 to 50 degrees, or approximately 45 degrees. In such a relationship, the polarizing plate may exhibit suitable performance. In this structure, a thickness-direction retardation of the biaxial retardation film may be in the same range as the thickness-direction retardation of the retardation layer. For example, the thickness-direction retardation of the positive biaxial retardation film may be approximately 160 nm or less, 120 nm or less, 10 to 110 nm or 40 to 80 nm. In addition, in-plane retardation of the positive biaxial retardation film may be in the same range as the in-plane retardation of the retardation layer described above.

In the multilayer structure including the positive biaxial retardation film, the retardation layer may further include a positive uniaxial retardation film. In this case, as shown in FIG. 6, in the retardation layer, a positive biaxial retardation film 1023 may be disposed closer to an absorbing polarizer 101 than a positive uniaxial retardation film 1022.

In the structure shown in FIG. 6, a slow axis of the positive biaxial retardation film is parallel to a light absorption axis of the absorbing polarizer, and an angle between the slow axis of the positive uniaxial retardation film and the light absorption axis of the absorbing polarizer may be approximately 30 to 60 or 40 to 50 degrees, or approximately 45 degrees. The term "vertical, perpendicular, horizontal or parallel" used herein refers to substantially vertical, perpendicular, horizontal or parallel in the range not damaging a desired effect. Therefore, each term may include an error within ±15, ±10, ±5 or ±3 degrees.

In the structure shown in FIG. 6, a thickness-direction retardation of the positive biaxial retardation film may be in the same range as the thickness-direction retardation of the retardation layer described above. For example, in the structure of FIG. 6, the thickness-direction retardation of the positive biaxial retardation film may be 220, 190, 180, 150, 130 or 100 nm or less. In addition, the thickness-direction retardation of the positive biaxial retardation film may be 10 or 40 nm or more.

In the structure shown in FIG. 6, the sum of in-plane retardation of the positive biaxial retardation film and in-plane retardation of the positive uniaxial retardation film may be controlled to be in the same range as the in-plane retardation of the retardation layer. For example, the in-plane retardation of the respective films may be controlled such that the in-plane retardation of the positive biaxial retardation film is in the range of 10 to 200 nm, the in-plane retardation of the positive uniaxial retardation film is in the range of 100 to 200 nm, and the sum thereof is in the range of the in-plane retardation of the retardation layer.

When the retardation layer including a positive biaxial retardation film is a multilayer structure, the retardation layer may further include a negative biaxial retardation film. In this case, for example, as shown in FIG. 7, in a polarizing plate, a positive biaxial retardation film 1023 may be disposed closer to an absorbing polarizer 101 than a positive biaxial retardation film 1024, or as shown in FIG. 8, a negative biaxial retardation film 1024 may be disposed closer to an absorbing polarizer 101 than a positive biaxial retardation film 1023.

In the structure shown in FIG. 7, a slow axis of the positive biaxial retardation film may be parallel to a light absorption axis of the absorbing polarizer. In addition, an angle between a slow axis of the negative biaxial retardation film and a light absorption axis of the absorbing polarizer may be approximately 30 to 60 or 40 to 50 degrees, or approximately 45 degrees.

In the structure of FIG. 7, the sum of thickness-direction retardation of the positive biaxial retardation film and thickness-direction retardation of the negative biaxial retardation film may be controlled to be in the range of the thickness-direction retardation of the retardation layer, for example, of 60 to 270, 90 to 240, 120 to 240 or 150 to 220 nm. For example, the thickness-direction retardation of the positive biaxial retardation film may be approximately 200 to 300 nm, approximately 200 to 270 nm, or approximately 240 nm, the thickness-direction retardation of the negative biaxial retardation film may be in the range of approximately 0 to −180 nm, and the sum may be controlled to be in the above range. In addition, in the structure of FIG. 7, the sum of in-plane retardation of the positive biaxial retardation film and in-plane retardation of the negative biaxial retardation film may be controlled to be in the range of the in-plane retardation of the retardation layer. For example, the in-plane retardation of the positive biaxial retardation film may be controlled to be in the range of approximately 10 to 200 nm, the in-plane retardation of the negative biaxial retardation film may be controlled to be in the range of approximately 100 to 200 nm, and the sum may be controlled to be in the above range.

Meanwhile, in the structure of FIG. 8, an angle between a slow axis of the positive biaxial retardation film and a light absorption axis of the absorbing polarizer may be approximately 30 to 60 or 40 to 50 degrees, or approximately 45 degrees. In addition, a slow axis of the negative biaxial retardation film may be parallel to the light absorption axis of the absorbing polarizer.

In the structure of FIG. 8, the sum of thickness-direction retardation of the positive biaxial retardation film and thickness-direction retardation of the negative biaxial retardation film may be controlled to be in the range of the thickness-direction retardation of the retardation layer, for example, of 60 to 200, 70 to 180, 90 to 160 or 100 to 155 nm. For example, the thickness-direction retardation of the positive biaxial retardation film may be controlled to be approximately 190 to 300 or 200 to 300 nm, or approximately 240 nm, the thickness-direction retardation of the negative biaxial retardation film may be controlled to be −60 to −180 nm, and the sum may be controlled to be in the above range. In addition, in the structure of FIG. 8, the sum of in-plane retardation of the positive biaxial retardation film and in-plane retardation of the negative biaxial retardation film may be controlled to be in the range of the in-plane retardation of the retardation layer. For example, the in-plane retardation of the positive biaxial retardation film may be controlled to be approximately 190 to 300 nm or 200 to 300 nm, or approximately 240 nm, the in-plane retardation of the negative biaxial retardation film may be controlled to be in the range of −60 to −180 nm, and the sum may be controlled to be in the above range.

In another example, the retardation layer of the polarizing plate may include a negative biaxial retardation film and a C plate. The retardation layer may be a film in which the negative biaxial retardation film and the C plate are stacked. In such a case, for example, as shown in FIG. 9, a C plate 1021 may be disposed closer to an absorbing polarizer 101, or as shown in FIG. 10, a negative biaxial retardation film 1024 may be disposed closer to an absorbing polarizer 101.

In the structure shown in FIG. 9, an angle between a slow axis of the negative biaxial retardation film and a light absorption axis of the absorbing polarizer may be approximately 30 to 60 or 40 to 50 degrees, or approximately 45 degrees. In such a relationship, the polarizing plate may exhibit suitable performance. In the structure of FIG. 9, the sum of thickness-direction retardation of the C plate and thickness-direction retardation of the negative biaxial retardation film may be controlled to be in the range of the thickness-direction retardation of the retardation layer, for example, of 70 to 250, 80 to 220, 100 to 190 or 120 to 170 nm. For example, the thickness-direction retardation of the negative biaxial retardation film may be controlled to be approximately 0 to −170 nm, the thickness-direction retardation of the C plate may be controlled to be approximately 200 to 300 nm or 240 nm, and the sum may be controlled to be in the range. In addition, in the structure of FIG. 9, in-plane retardation of the negative biaxial retardation film may be controlled to be in the range of the in-plane retardation of the retardation layer described above.

In the structure of FIG. 10, an angle between a slow axis of the negative biaxial retardation film and a light absorption axis of the absorbing polarizer may be, for example, approximately 30 to 60 degrees or 40 to 50 degrees, or approximately 45 degrees. In such a relationship, the polarizing plate may exhibit suitable performance. In the structure of FIG. 10, the sum of thickness-direction retardation of the C plate and thickness-direction retardation of the negative biaxial retardation film may be controlled to be in the range of the thickness-direction retardation of the retardation layer, for example, of 50 to 250, 70 to 230, 90 to 200 or 110 to 180 nm. For example, the thickness-direction retardation of the negative biaxial retardation film may be controlled to be approximately 0 to −160 nm, the thickness-direction retardation of the C plate may be controlled to be approximately 200 to 300 nm or approximately 230 nm, and the sum may be controlled to be in the above range. In addition, in the structure of FIG. 10, in-plane retardation of the negative biaxial retardation film may be controlled to be in the range of the in-plane retardation of the retardation layer.

The positive uniaxial retardation film, positive or negative biaxial retardation film or C plate may be, for example, a polymer film or liquid crystal film. For example, the polymer film may be formed using a light-transmitting polymer film capable of providing optical anisotropy due to stretching by a suitable method, or the liquid crystal layer may be formed by orienting a liquid crystal compound. In addition, a non-stretched polymer film may be used as long as it has the optical anisotropy. In one example, as the polymer film, a film having a light transmittance of 70, 80 or 85% or more and manufactured by an absorbent casting method may be used. The polymer film may generally be a film having a thickness of approximately 3 mm or less, 1 μm to 1 mm, or 5 to 500 μm in consideration of producibility of a uniformly-stretched film.

For example, the polymer film may be a polyolefin film such as a polyethylene film or polypropylene film, a cycloolefin polymer (COP) film such as a polynorbonene film, a polyvinylchloride film, a polyacrylonitrile film, a polysulfone film, a polyacrylate film, a PVA film or a cellulose ester-based polymer film such as a triacetyl cellulose (TAC) film, or a copolymer film of at least two of the monomers forming the polymer. In one example, the polymer film may be a COP film or acryl film. Here, as the COP, a ring-opening polymer or hydrogenated product of cycloolefin such as norbornene, an addition-polymer of cycloolefin, a copolymer of cycloolefin and another comonomer such as alpha-olefin, or a graft polymer formed by modifying the polymer or copolymer with an unsaturated carboxylic acid or derivative thereof may be used, but the present application is not limited thereto. The positive uniaxial retardation film, positive or negative biaxial retardation film or C plate may also be formed using a liquid crystal film known to form each film in the related art.

The retardation films or the retardation layer and absorbing polarizer may form optical films attached to each other by a suitable pressure-sensitive adhesive or adhesive. The retardation film or retardation layer and the absorbing polarizer may be directly attached by the adhesive layer or pressure-sensitive adhesive layer, and when necessary, may be attached by further including a primer layer.

A method of attaching the retardation films to each other or the retardation film to the polarizer is not particularly limited. For example, a method of coating an adhesive or pressure-sensitive adhesive composition on one surface of the polarizer or retardation film and curing the adhesive composition after lamination, or laminating the polarizer or retardation films by a dropping method using an adhesive or pressure-sensitive adhesive composition and curing the composition may be used. Here, the curing of the composition may be performed by radiating active energy rays having a suitable strength with a suitable intensity of radiation in consideration of components included in the composition.

In addition, the polarizing plate may further include a polarizer protective film present on one surface of the polarizer, for example, between the polarizer and the retardation layer or one or both surfaces opposite to a surface in contact with the retardation layer of the polarizer. A kind of the polarizer protective film used herein is not particularly limited, and all conventional films known in the related art may be used.

Another aspect of the present application provides a display. The illustrative display may include the polarizing plate described above.

A specific kind of display including the polarizing plate is not particularly limited. The display may be a liquid crystal display such as a reflective or transflective liquid crystal display, or an organic light emitting device.

In the display, an arrangement of the polarizing plate is not particularly limited, and a known arrangement may be employed. For example, in the reflective liquid crystal display, the polarizing plate may be used as any one of polarizing plates of a liquid crystal panel to prevent reflection of external light and ensure visibility. In addition, in the organic light emitting device, to prevent reflection of external light and ensure visibility, the polarizing plate may be disposed outside an electrode layer of the organic light emitting device.

An illustrative polarizing plate can exhibit desired characteristics in a wide range of wavelengths, and have excellent reflection and visibility at an inclined angle. In one embodiment, the polarizing plate can be used in a reflective or transflective liquid crystal display or an organic light emitting device.

DESCRIPTION OF THE MARKS

100: the retardation film
101: the polarizer
102: the retardation layer
1021: the C plate
1022: the positive uniaxial retardation film
1023: the positive biaxial retardation film
1024: the negative biaxial retardation film

DETAILED DESCRIPTION OF ILLUSTRATIVE EMBODIMENTS

Hereinafter, the polarizing plate will be described with reference to Examples and Comparative Examples in detail. However, the scope of the polarizing plate is not limited to the following Examples.

1. In-Plane or Thickness-Direction Retardation

In-plane or thickness-direction retardation of a retardation film was measured with respect to light having a wavelength of 550 nm using an Axoscan tool (Axomatrics) capable of measuring 16 Muller matrixes. 16 of the Muller matrixes were obtained according to the manual of the manufacturer using the Axoscan tool, and thereby retardation was extracted.

2. Evaluation of Reflectivity and Omnidirectional Colorimetric Characteristic

Reflectivity at an inclined angle of 50 degrees was measured by measuring an albedo at an inclined angle of 50 degrees of light having a wavelength of 400 to 700 nm on the side of an absorbing polarizer of the polarizing plate manufactured in Example or Comparative Example using a spectrometer (N&K). In addition, an omnidirectional colorimetric characteristic of the polarizing plate was measured by a method of measuring the albedo and colorimetric characteristic at a predetermined viewing angle according to the manual of the manufacturer using EZ-contrast equipment produced by Eldim.

Example 1

Figure 1:
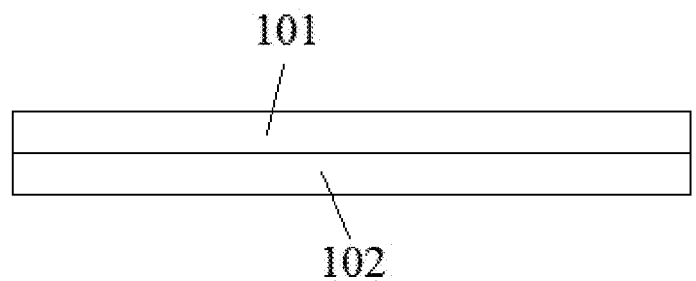
FIG. 1 is a diagram of an illustrative polarizing plate.
Figure 2:
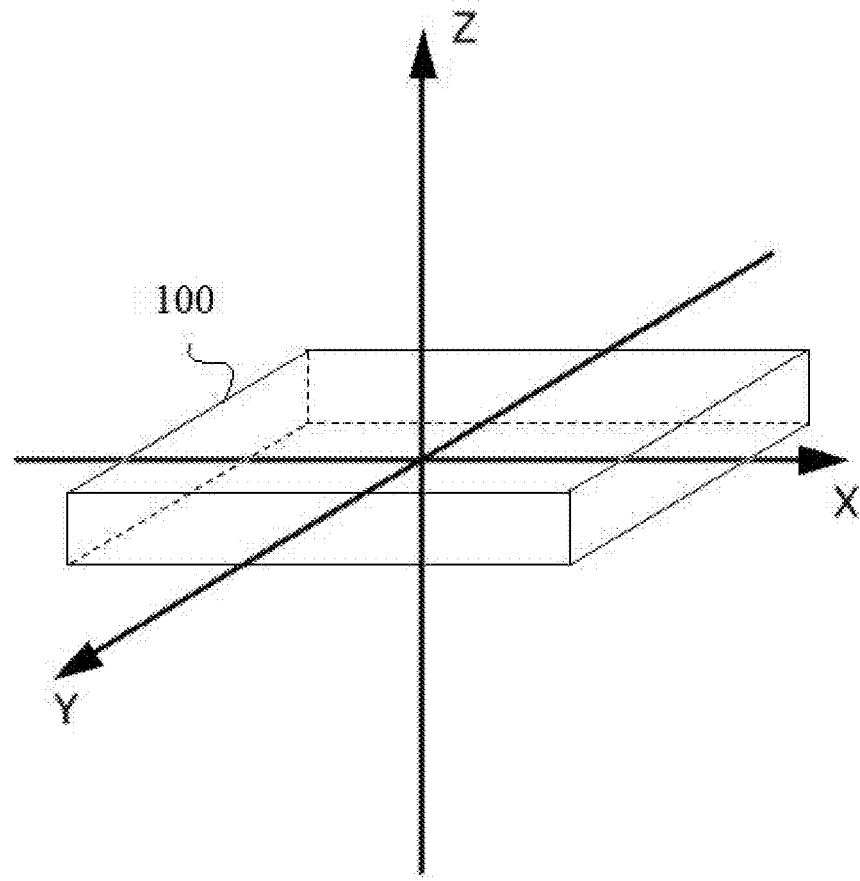
FIG. 2 is a schematic diagram showing x, y and z axes of a retardation film.
Figure 3:
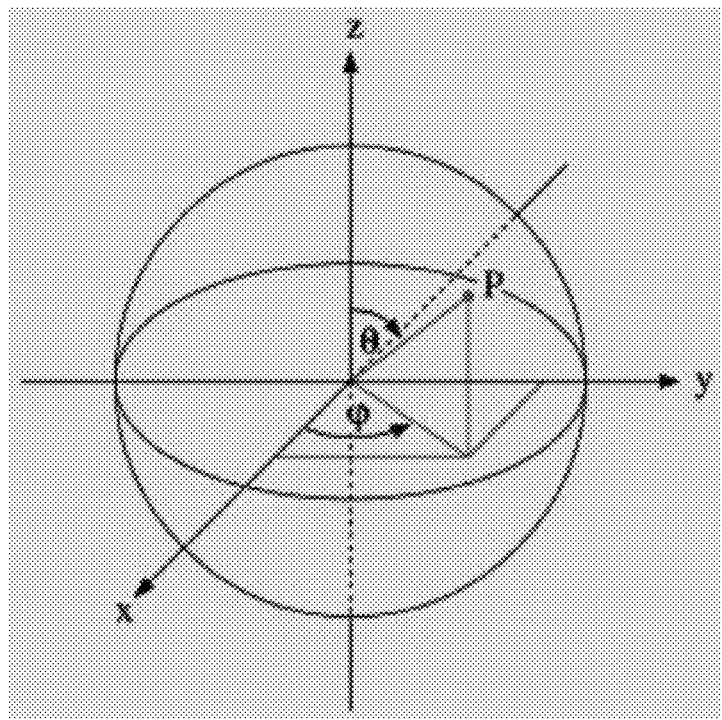
FIG. 3 is a diagram explaining an inclined angle and a radial angle.
Figure 4:
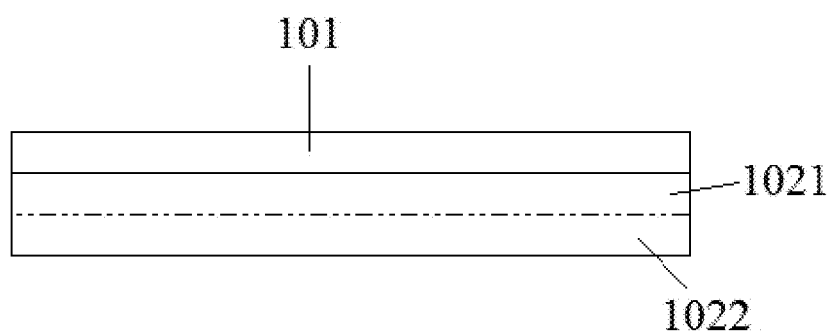
FIGS. 4 to 10 are schematic diagrams of illustrative polarizing plates.
Figure 5:
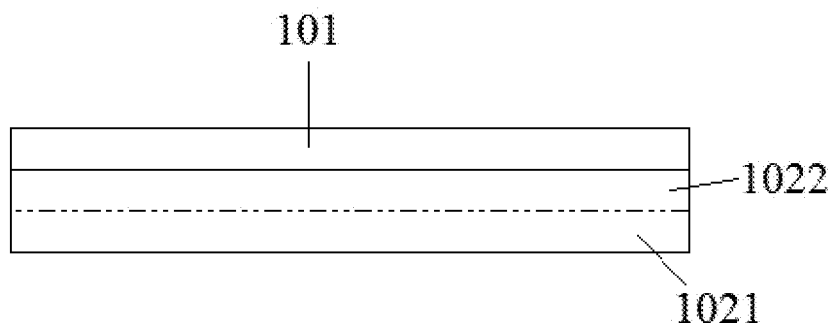

A polarizing plate was manufactured using a liquid crystal film having in-plane retardation of approximately 137.5 nm as a positive uniaxial retardation film and a known polymer film (having a thickness-direction retardation of 0 to 150 nm) exhibiting characteristics of a C plate as a C plate. Particularly, a polarizing plate having a structure shown in FIG. 5 was manufactured by sequentially stacking a PVA absorbing polarizer, the positive uniaxial retardation film and the C plate. During the manufacture, an angle between a light absorption axis of the polarizer and a slow axis of the positive uniaxial retardation film was designed to be approximately 45 degrees.

Figure 11:
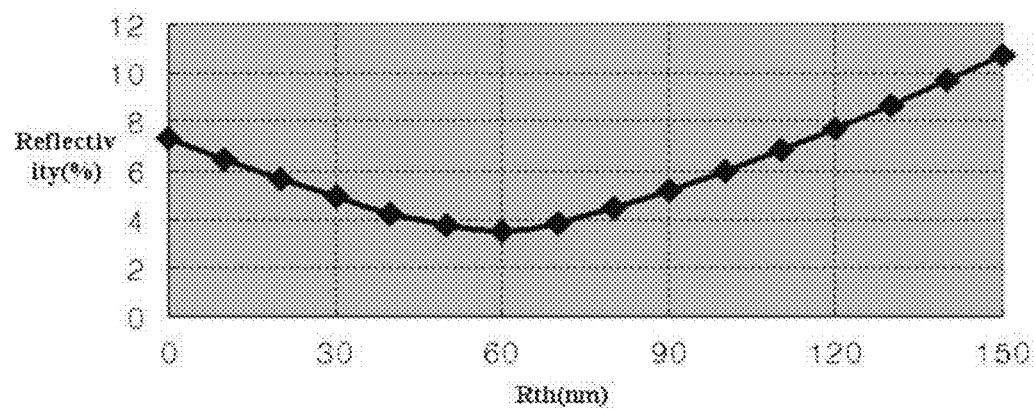
FIGS. 11 to 27 are diagrams showing results of evaluating reflectivity of a polarizing plate or omnidirectional colorimetric characteristics in Examples and Comparative Examples.
Figure 12:
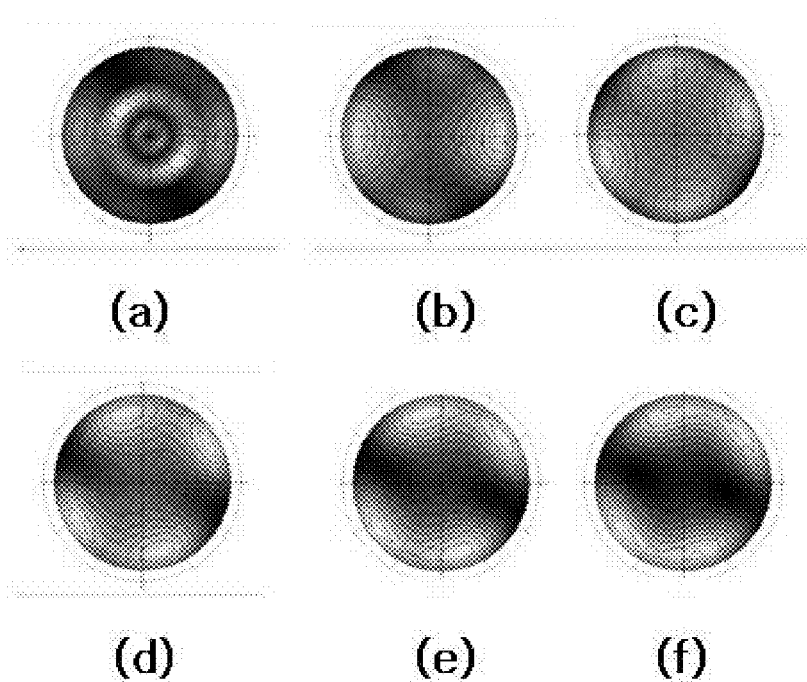

FIG. 11 shows a reflectivity at an inclined angle of 50 degrees measured by continuously changing a thickness-direction retardation of the C plate from 0 to 150 nm in the structure described above, and FIG. 12 is a diagram showing an omnidirectional colorimetric characteristic of the polarizing plate in the structure. FIG. 12(a) shows a colorimetric characteristic at a radial angle of 50 degrees in the structure to which the C plate having a thickness-direction retardation of 0 nm is applied, FIG. 12(b) shows a colorimetric characteristic at a radial angle of 50 degrees in the structure to which the C plate having a thickness-direction retardation of 30 nm was applied, FIG. 12(c) shows a colorimetric characteristic at a radial angle of 50 degrees in the structure to which the C plate having a thickness-direction retardation of 60 nm was applied, FIG. 12(d) shows a colorimetric characteristic at a radial angle of 50 degrees in the structure to which the C plate having a thickness-direction retardation of 90 nm was applied, FIG. 12(e) shows a colorimetric characteristic at a radial angle of 50 degrees in the structure to which the C plate having a thickness-direction retardation of 120 nm was applied, and FIG. 12(f) shows a colorimetric characteristic at a radial angle of 50 degrees in the structure to which the C plate having a thickness-direction retardation of 150 nm was applied.

Example 2

A polarizing plate was manufactured using a polymer film having in-plane retardation of approximately 137.5 nm as a positive biaxial retardation film. Particularly, a polarizing plate was manufactured by sequentially stacking a PVA absorbing polarizer and the positive biaxial retardation film. During the manufacture, an angle between a light absorption axis of the polarizer and a slow axis of the positive biaxial retardation film was designed to be approximately 45 degrees.

Figure 13:
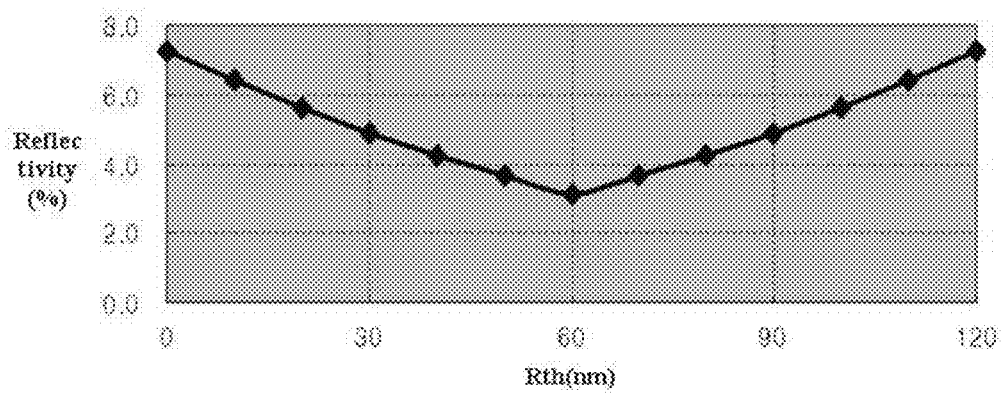
Figure 14:
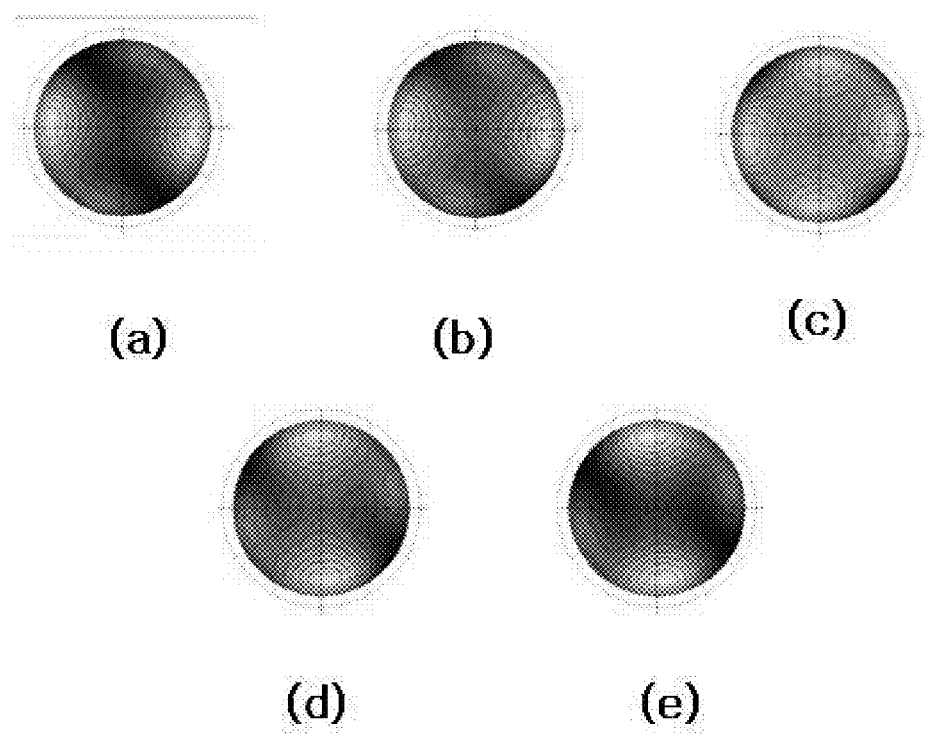

FIG. 13 shows a reflectivity at an inclined angle of 50 degrees measured by continuously changing a thickness-direction retardation of the positive biaxial retardation film from 0 to 120 nm in the structure described above, and FIG. 14 is a diagram showing an omnidirectional colorimetric characteristic of the polarizing plate in the structure. FIG. 14(a) shows a colorimetric characteristic at a radial angle of 50 degrees in the structure to which the positive biaxial retardation film having a thickness-direction retardation of 0 nm was applied, FIG. 14(b) shows a colorimetric characteristic at a radial angle of 50 degrees in the structure to which the positive biaxial retardation film having a thickness-direction retardation of 30 nm was applied, FIG. 14(c) shows a colorimetric characteristic at a radial angle of 50 degrees in the structure to which the positive biaxial retardation film having a thickness-direction retardation of 60 nm was applied, FIG. 14(d) shows a colorimetric characteristic at a radial angle of 50 degrees in the structure to which the positive biaxial retardation film having a thickness-direction retardation of 90 nm was applied, and FIG. 14(e) shows a colorimetric characteristic at a radial angle of 50 degrees in the structure to which the positive biaxial retardation film having a thickness-direction retardation of 120 nm was applied.

Example 3

Figure 6:
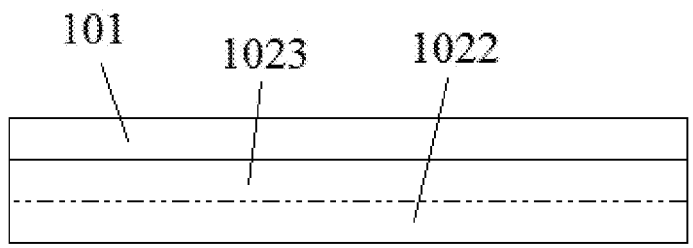
Figure 15:
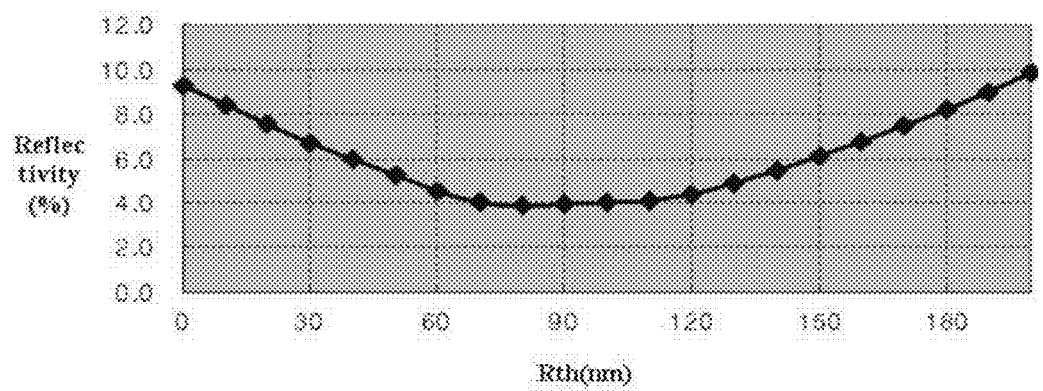
Figure 16:
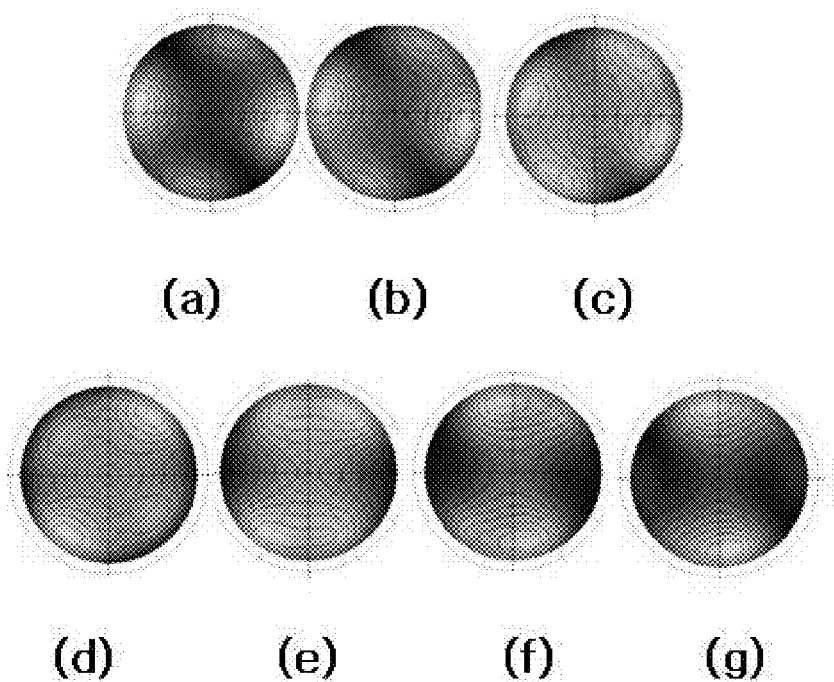

A polarizing plate was manufactured using a liquid crystal film having in-plane retardation of approximately 137.5 nm as a positive uniaxial retardation film, and a polymer film having in-plane retardation of approximately 90 nm as a positive biaxial retardation film. Particularly, a polarizing plate having the structure shown in FIG. 6 was manufactured by sequentially stacking a PVA absorbing polarizer, the positive biaxial retardation film and the positive uniaxial retardation film. The polarizing plate had the structure shown in FIG. 6, but had a polarizer protective film (TAC film) having a thickness-direction retardation of approximately −60 nm and in-plane retardation of approximately 2 to 3 nm between a polarizer 101 and a positive biaxial retardation film 1023 of the polarizing plate. During the manufacture, an angle between a light absorption axis of the polarizer and a slow axis of the positive uniaxial retardation film was designed to be approximately 45 degrees, and an angle between the light absorption axis and a slow axis of the positive biaxial retardation film was designed to be approximately 0 degrees. FIG. 15 shows a reflectivity at an inclined angle of 50 degrees measured by continuously changing a thickness-direction retardation of the positive biaxial retardation film from 60 to 260 nm in the structure described above, and FIG. 16 is a diagram showing an omnidirectional colorimetric characteristic of the polarizing plate in the structure. FIG. 16(a) shows a colorimetric characteristic at a radial angle of 50 degrees in the structure to which the positive biaxial retardation film having a thickness-direction retardation of 60 nm was applied, FIG. 16(b) shows a colorimetric characteristic at a radial angle of 50 degrees in the structure to which the positive biaxial retardation film having a thickness-direction retardation of 90 nm was applied, FIG. 16(c) shows a colorimetric characteristic at a radial angle of 50 degrees in the structure to which the positive biaxial retardation film having a thickness-direction retardation of 120 nm was applied, FIG. 16(d) shows a colorimetric characteristic at a radial angle of 50 degrees in the structure to which the positive biaxial retardation film having a thickness-direction retardation of 150 nm was applied, FIG. 16(e) shows a colorimetric characteristic at a radial angle of 50 degrees in the structure to which the positive biaxial retardation film having a thickness-direction retardation of 180 nm was applied, FIG. 16(f) shows a colorimetric characteristic at a radial angle of 50 degrees in the structure to which the positive biaxial retardation film having a thickness-direction retardation of 210 nm was applied, and FIG. 16(g) shows a colorimetric characteristic at a radial angle of 50 degrees in the structure to which the positive biaxial retardation film having a thickness-direction retardation of 240 nm was applied.

Example 4

A polarizing plate was manufactured using a liquid crystal film having in-plane retardation of approximately 137.5 nm as a positive uniaxial retardation film, and a polymer film having in-plane retardation of approximately 90 nm as a positive biaxial retardation film. Particularly, a polarizing plate having the structure shown in FIG. 6 was manufactured by sequentially stacking a PVA absorbing polarizer, the positive biaxial retardation film and the positive uniaxial retardation film, but a TAC film was not disposed between a polarizer 101 and a positive biaxial retardation film 1023, unlike Example 3. During the manufacture, an angle between a light absorption axis of the polarizer and a slow axis of the positive uniaxial retardation film was designed to be approximately 45 degrees, and an angle between the light absorption axis and a slow axis of the positive biaxial retardation film was designed to be approximately 0 degrees.

Figure 17:
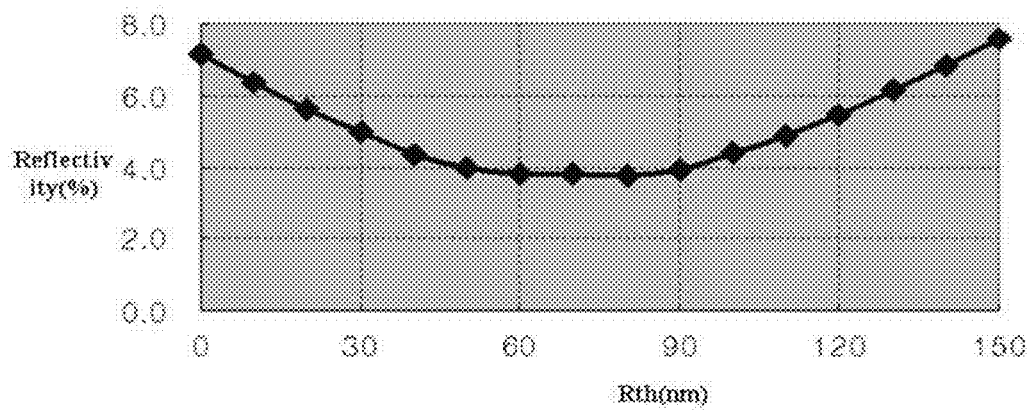
Figure 18:
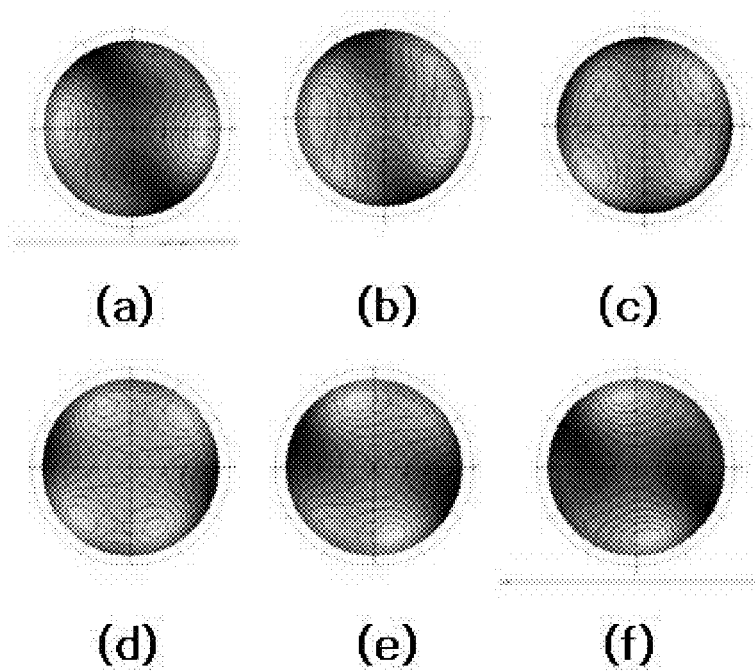

FIG. 17 shows a reflectivity at an inclined angle of 50 degrees measured by continuously changing a thickness-direction retardation of the positive biaxial retardation film from 0 to 150 nm in the structure described above, and FIG. 18 is a diagram showing an omnidirectional colorimetric characteristic of the polarizing plate in the structure. FIG. 18(a) shows a colorimetric characteristic at a radial angle of 50 degrees in the structure to which the positive biaxial retardation film having a thickness-direction retardation of 0 nm was applied, FIG. 18(b) shows a colorimetric characteristic at a radial angle of 50 degrees in the structure to which the positive biaxial retardation film having a thickness-direction retardation of 30 nm was applied, FIG. 18(c) shows a colorimetric characteristic at a radial angle of 50 degrees in the structure to which the positive biaxial retardation film having a thickness-direction retardation of 60 nm was applied, FIG. 18(d) shows a colorimetric characteristic at a radial angle of 50 degrees in the structure to which the positive biaxial retardation film having a thickness-direction retardation of 90 nm was applied, FIG. 18(e) shows a colorimetric characteristic at a radial angle of 50 degrees in the structure to which the positive biaxial retardation film having a thickness-direction retardation of 120 nm was applied, and FIG. 18(f) shows a colorimetric characteristic at a radial angle of 50 degrees in the structure to which the positive biaxial retardation film having a thickness-direction retardation of 150 nm was applied.

Example 5

Figure 7:
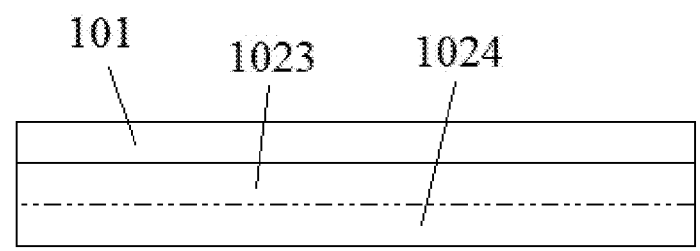

A polarizing plate was manufactured using a polymer film having in-plane retardation of approximately 90 nm as a positive biaxial retardation film, and a polymer film having in-plane retardation of approximately 137.5 nm as a negative biaxial retardation film. Particularly, a polarizing plate having the structure shown in FIG. 7 was manufactured by sequentially stacking a PVA absorbing polarizer, the positive biaxial retardation film and the negative biaxial retardation film. During the manufacture, an angle between a light absorption axis of the polarizer and a slow axis of the positive biaxial retardation film was designed to be approximately 0 degrees, and an angle between the light absorption axis and a slow axis of the negative biaxial retardation film was designed to be approximately 45 degrees.

Figure 19:
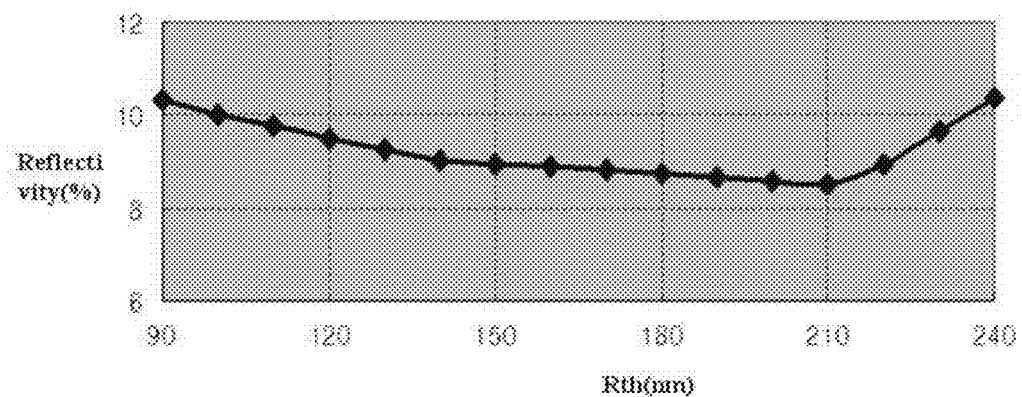
Figure 20:
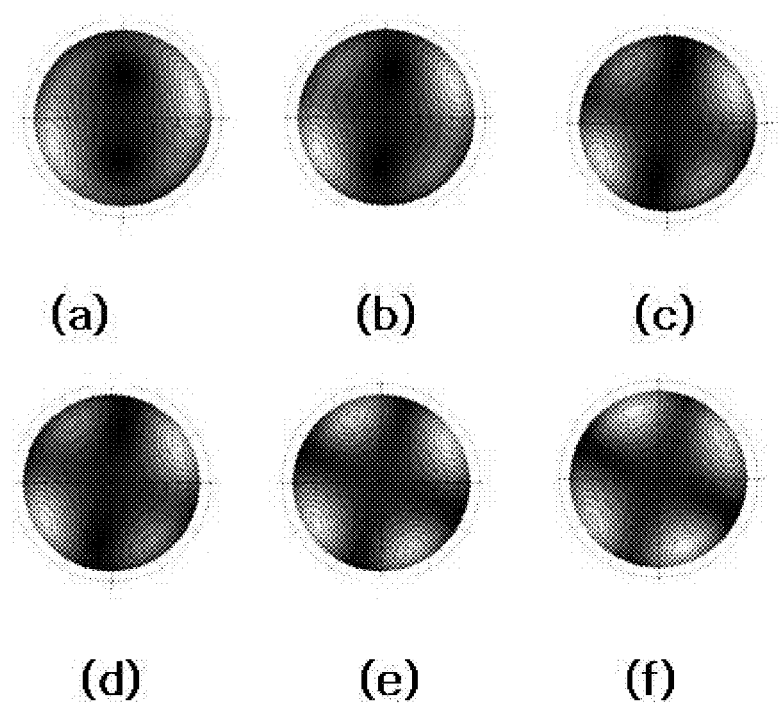

FIG. 19 shows a reflectivity at an inclined angle of 50 degrees measured by continuously changing a sum of thickness-direction retardation of the positive biaxial retardation film and the negative biaxial retardation film from 90 to 240 nm in the structure described above, and FIG. 20 is a diagram showing an omnidirectional colorimetric characteristic of the polarizing plate in the structure. In the measurement of the reflectivity shown in FIG. 19, the thickness-direction retardation of the positive biaxial retardation film was fixed to 240 nm, and the thickness-direction retardation of the negative biaxial retardation film was changed. FIG. 20(a) shows a colorimetric characteristic at a radial angle of 50 degrees in the structure to which the positive biaxial retardation film having a thickness-direction retardation of 60 nm and the negative biaxial retardation film having a thickness-direction retardation of −180 nm were applied, FIG. 20(b) shows a colorimetric characteristic at a radial angle of 50 degrees in the structure to which the positive biaxial retardation film having a thickness-direction retardation of 240 nm and the negative biaxial retardation film having a thickness-direction retardation of −150 nm were applied, FIG. 20(c) shows a colorimetric characteristic at a radial angle of 50 degrees in the structure to which the positive biaxial retardation film having a thickness-direction retardation of 240 nm and the negative biaxial retardation film having a thickness-direction retardation of −120 nm were applied, FIG. 20(d) shows a colorimetric characteristic at a radial angle of 50 degrees in the structure to which the positive biaxial retardation film having a thickness-direction retardation of 240 nm and the negative biaxial retardation film having a thickness-direction retardation of −90 nm were applied, FIG. 20(*e*) shows a colorimetric characteristic at a radial angle of 50 degrees in the structure to which the positive biaxial retardation film having a thickness-direction retardation of 240 nm and the negative biaxial retardation film having a thickness-direction retardation of −60 nm were applied, and FIG. 20(*f*) shows a colorimetric characteristic at a radial angle of 50 degrees in the structure to which the positive biaxial retardation film having a thickness-direction retardation of 240 nm and the negative biaxial retardation film having a thickness-direction retardation of −30 nm were applied.

Example 6

Figure 8:
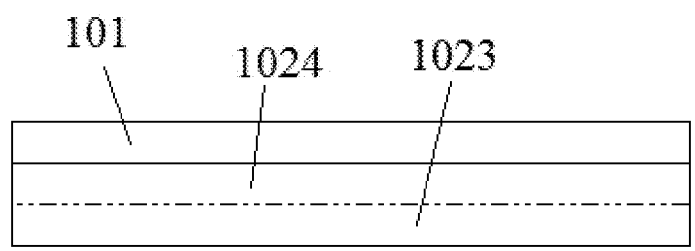
Figure 21:
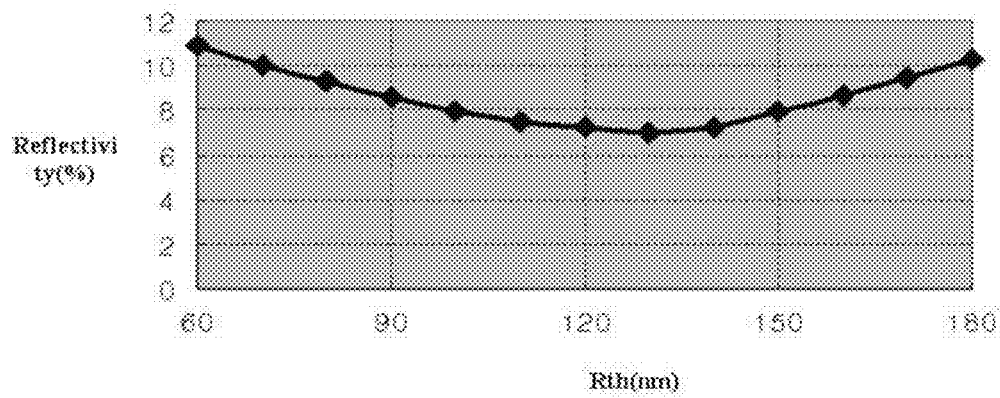
Figure 22:
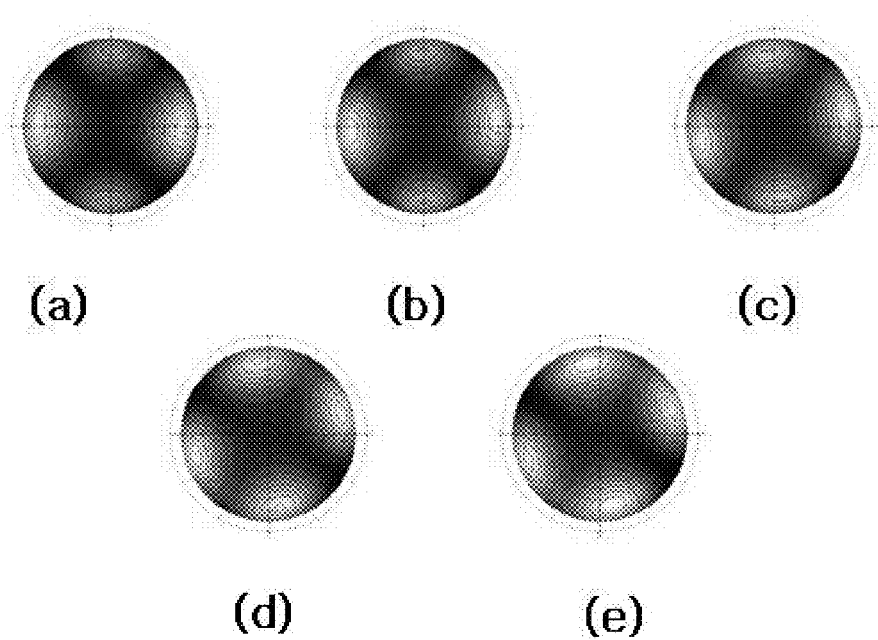

A polarizing plate was manufactured using a polymer film having in-plane retardation of approximately 137.5 nm as a positive biaxial retardation film, and a polymer film having in-plane retardation of approximately −100 nm as a negative biaxial retardation film. Particularly, a polarizing plate having the structure shown in FIG. 8 was manufactured by sequentially stacking a PVA absorbing polarizer, the negative biaxial retardation film and the positive biaxial retardation film. During the manufacture, an angle between a light absorption axis of the polarizer and a slow axis of the positive biaxial retardation film was designed to be approximately 45 degrees, and an angle between the light absorption axis and a slow axis of the negative biaxial retardation film was designed to be approximately 0 degrees. FIG. 21 shows a reflectivity at an inclined angle of 50 degrees measured by continuously changing a sum of thickness-direction retardation of the positive biaxial retardation film and the negative biaxial retardation film from 60 to 180 nm in the structure described above, and FIG. 22 is a diagram showing an omnidirectional colorimetric characteristic of the polarizing plate in the structure. In the measurement of the reflectivity shown in FIG. 21, the thickness-direction retardation of the positive biaxial retardation film was fixed to 180 nm, and the thickness-direction retardation of the negative biaxial retardation film was changed. FIG. 22(*a*) shows a colorimetric characteristic at a radial angle of 50 degrees in the structure to which the positive biaxial retardation film having a thickness-direction retardation of 180 nm and the negative biaxial retardation film having a thickness-direction retardation of −120 nm were applied, FIG. 22(*b*) shows a colorimetric characteristic at a radial angle of 50 degrees in the structure to which the positive biaxial retardation film having a thickness-direction retardation of 180 nm and the negative biaxial retardation film having a thickness-direction retardation of −90 nm were applied, FIG. 22(*c*) shows a colorimetric characteristic at a radial angle of 50 degrees in the structure to which the positive biaxial retardation film having a thickness-direction retardation of 180 nm and the negative biaxial retardation film having a thickness-direction retardation of −60 nm were applied, FIG. 22(*d*) shows a colorimetric characteristic at a radial angle of 50 degrees in the structure to which the positive biaxial retardation film having a thickness-direction retardation of 180 nm and the negative biaxial retardation film having a thickness-direction retardation of −30 nm were applied, and FIG. 22(*e*) shows a colorimetric characteristic at a radial angle of 50 degrees in the structure to which the positive biaxial retardation film having a thickness-direction retardation of 180 nm and the negative biaxial retardation film having a thickness-direction retardation of 0 nm were applied.

Example 7

Figure 9:
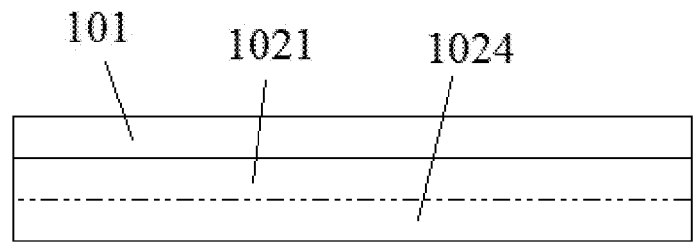
Figure 23:
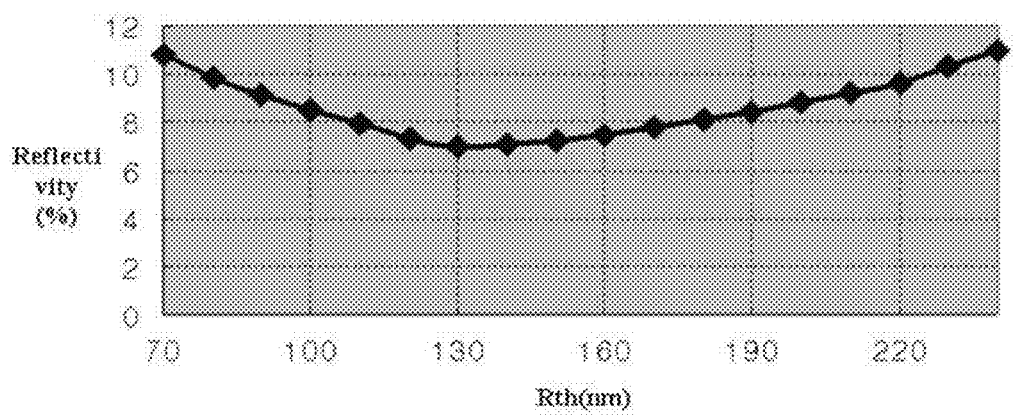
Figure 24:
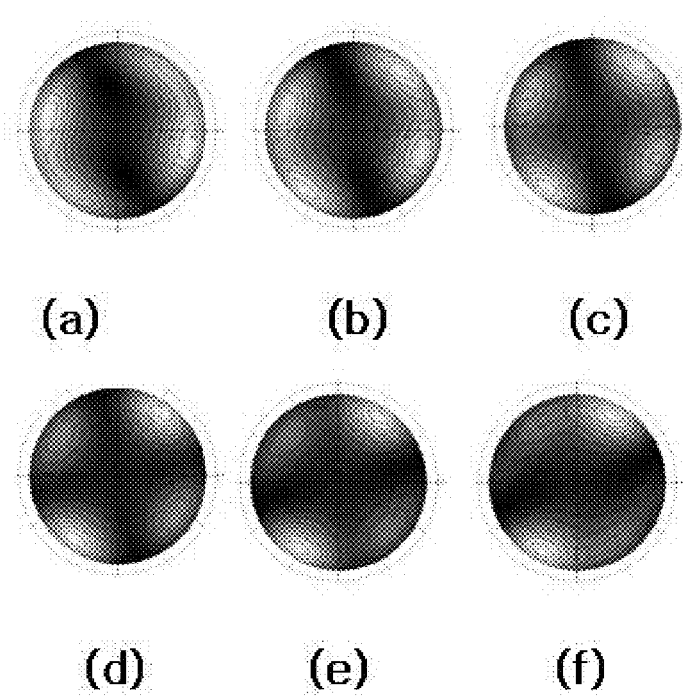

A polarizing plate was manufactured using a polymer film having a thickness-direction retardation of approximately 240 nm as a C plate, and a polymer film having in-plane retardation of approximately 137.5 nm as a negative biaxial retardation film. Particularly, a polarizing plate having the structure shown in FIG. 9 was manufactured by sequentially stacking a PVA absorbing polarizer, the C plate and the negative biaxial retardation film. During the manufacture, an angle between a light absorption axis of the polarizer and a slow axis of the negative biaxial retardation film was designed to be approximately 45 degrees. FIG. 23 shows a reflectivity at an inclined angle of 50 degrees measured by continuously changing a sum of thickness-direction retardation of the C plate and the negative biaxial retardation film from 70 to 220 nm in the structure described above, and FIG. 24 is a diagram showing an omnidirectional colorimetric characteristic of the polarizing plate in the structure. In the measurement of the reflectivity shown in FIG. 23, the thickness-direction retardation of the C plate was fixed to 240 nm, and the thickness-direction retardation of the negative biaxial retardation film was changed. FIG. 24(*a*) shows a colorimetric characteristic at a radial angle of 50 degrees in the structure to which the C plate having a thickness-direction retardation of 240 nm and the negative biaxial retardation film having a thickness-direction retardation of −130 nm were applied, FIG. 24(*b*) shows a colorimetric characteristic at a radial angle of 50 degrees in the structure to which the C plate having a thickness-direction retardation of 240 nm and the negative biaxial retardation film having a thickness-direction retardation of −100 nm were applied, FIG. 24(*c*) shows a colorimetric characteristic at a radial angle of 50 degrees in the structure to which the C plate having a thickness-direction retardation of 240 nm and the negative biaxial retardation film having a thickness-direction retardation of −90 nm were applied, FIG. 24(*d*) shows a colorimetric characteristic at a radial angle of 50 degrees in the structure to which the C plate having a thickness-direction retardation of 240 nm and the negative biaxial retardation film having a thickness-direction retardation of −60 nm were applied, FIG. 24(*e*) shows a colorimetric characteristic at a radial angle of 50 degrees in the structure to which the C plate having a thickness-direction retardation of 240 nm and the negative biaxial retardation film having a thickness-direction retardation of −30 nm were applied, and FIG. 24(*f*) shows a colorimetric characteristic at a radial angle of 50 degrees in the structure to which the C plate having a thickness-direction retardation of 240 nm and the negative biaxial retardation film having a thickness-direction retardation of 0 nm were applied.

Example 8

Figure 10:
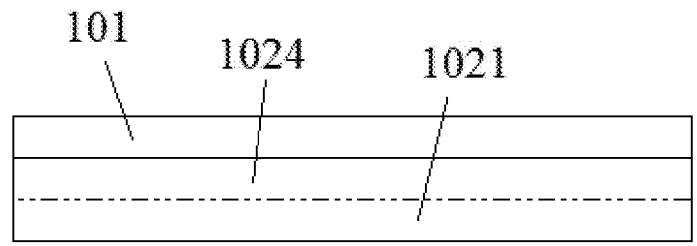

A polarizing plate was manufactured using a polymer film having a thickness-direction retardation of approximately 230 nm as a C plate, and a polymer film having in-plane retardation of approximately 137.5 nm as a negative biaxial retardation film. Particularly, a polarizing plate having the structure shown in FIG. 10 was manufactured by sequentially stacking a PVA absorbing polarizer, the negative biaxial retardation film and the C plate. During the manufacture, an angle between a light absorption axis of the polarizer and a slow axis of the negative biaxial retardation film was designed to be approximately 45 degrees.

Figure 25:
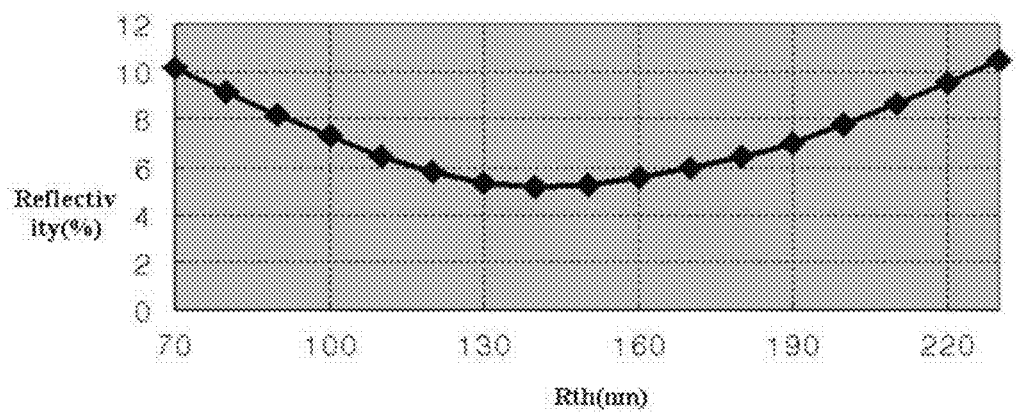
Figure 26:
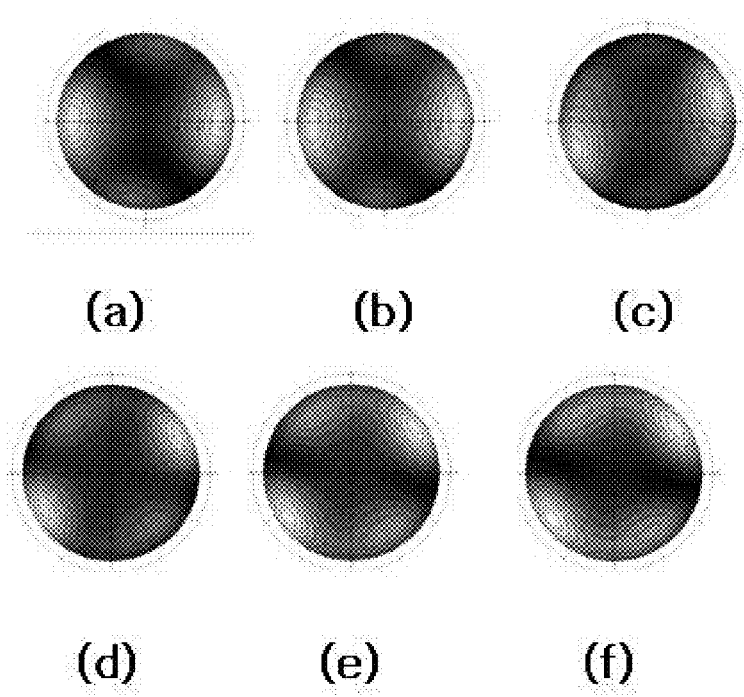

FIG. 25 shows a reflectivity at an inclined angle of 50 degrees measured by continuously changing a sum of thickness-direction retardation of the C plate and the negative biaxial retardation film from 70 to 220 nm in the structure described above, and FIG. 26 is a diagram showing an omnidirectional colorimetric characteristic of the polarizing plate in the structure. In the measurement of the reflectivity shown in FIG. 25, the thickness-direction retardation of the C plate was fixed to 230 nm, and the thickness-direction retardation of the negative biaxial retardation film was changed. FIG. 26(a) shows a colorimetric characteristic at a radial angle of 50 degrees in the structure to which the C plate having a thickness-direction retardation of 230 nm and the negative biaxial retardation film having a thickness-direction retardation of −150 nm were applied, FIG. 26(b) shows a colorimetric characteristic at a radial angle of 50 degrees in the structure to which the C plate having a thickness-direction retardation of 230 nm and the negative biaxial retardation film having a thickness-direction retardation of −120 nm were applied, FIG. 26(c) shows a colorimetric characteristic at a radial angle of 50 degrees in the structure to which the C plate having a thickness-direction retardation of 230 nm and the negative biaxial retardation film having a thickness-direction retardation of −90 nm were applied, FIG. 26(d) shows a colorimetric characteristic at a radial angle of 50 degrees in the structure to which the C plate having a thickness-direction retardation of 230 nm and the negative biaxial retardation film having a thickness-direction retardation of −60 nm were applied, FIG. 26(e) shows a colorimetric characteristic at a radial angle of 50 degrees in the structure to which the C plate having a thickness-direction retardation of 230 nm and the negative biaxial retardation film having a thickness-direction retardation of −30 nm were applied, and FIG. 26(f) shows a colorimetric characteristic at a radial angle of 50 degrees in the structure to which the C plate having a thickness-direction retardation of 230 nm and the negative biaxial retardation film having a thickness-direction retardation of 0 nm were applied.

Comparative Example 1

A polarizing plate was manufactured by attaching a polymer film having in-plane retardation of approximately 137.5 nm as a positive uniaxial retardation film on one surface of a PVA absorbing polarizer. During the manufacture, an angle between a light absorption axis of the polarizer and a slow axis of the positive uniaxial retardation film was designed to be approximately 45 degrees.

Figure 27:
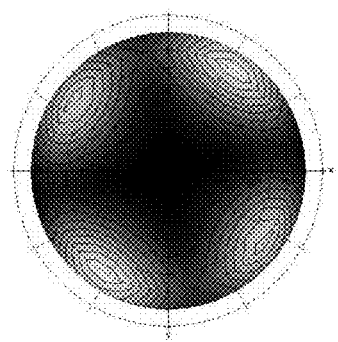

FIG. 27 shows a colorimetric characteristic of the polarizing plate having the structure described above, which was measured at an inclined angle of 50 degrees and a radial angle of 50 degrees. In addition, in Comparative Example 1, a reflectivity at an inclined angle of 50 degrees was approximately 14.9%.

What is claimed is:
1. A polarizing plate for minimizing reflecting properties in an organic light emitting device, comprising:
a polarizer; and
a retardation layer that is laminated on one side of the polarizer, wherein a reflectivity measure on a side of the polarizer of the polarizing plate is 12% or less at an inclined angle of 50 degrees and the inclined angle is an angle between a normal line of a surface of a polarizing plate and an observation direction,
wherein the retardation layer comprises a negative biaxial retardation film having a first Rth value according to formula 6, and a C plate having a second Rth value according to formula 6, wherein the sum of the first and second Rth values is from 10 nm to 300 nm, and an angle between a slow axis of the negative biaxial retardation film and a light absorption axis of the polarizer is from 40 degrees to 50 degrees,

$$Rth = d \times (Nz - Ny) \quad \text{[Formula 6]}$$

in Formula 6, d is a thickness of the negative biaxial retardation film or C plate, and Ny and Nz are refractive indexes in y and z axes of the negative biaxial retardation film or C plate, respectively, wherein the y axis is a direction parallel to a fast axis of the negative biaxial retardation film or C plate and z axis is a normal direction of a plane formed by the x and y axes, wherein the x axis may be a direction parallel to a slow axis of the negative biaxial retardation film or C plate, and
wherein one of the negative biaxial retardation film and the C plate contacts the polarizer.
2. The polarizing plate according to claim 1, of which a reflectivity measure on a side of the polarizer of the polarizing plate at all radial angles measured at the inclined angle of 50 degrees is 12% or less.
3. The polarizing plate according to claim 1, wherein the retardation layer satisfies the following Formula 7;

$$R(450)/R(550) < R(650)/R(550) \quad \text{[Formula 7]}$$

where R(450) is in-plane retardation of the retardation layer with respect to light having a wavelength of 450 nm, R(550) is in-plane retardation of the retardation layer with respect to light having a wavelength of 550 nm, and R(650) is in-plane retardation of the retardation layer with respect to light having a wavelength of 650 nm.
4. The polarizing plate according to claim 1, wherein the C plate is disposed closer to the polarizer than the negative biaxial retardation film, when the retardation layer comprises the negative biaxial retardation film and the C plate.
5. The polarizing plate according to claim 4, wherein the sum of a thickness-direction retardation of the C plate and a thickness-direction retardation of the negative biaxial retardation film is from 70 nm to 250 nm.
6. The polarizing plate according to claim 1, wherein the negative biaxial retardation film is disposed closer to the polarizer than the C plate, when the retardation layer comprises the negative biaxial retardation film and the C plate.
7. The polarizing plate according to claim 6, wherein the sum of a thickness-direction retardation of the C plate and a thickness-direction retardation of the negative biaxial retardation film is from 50 nm to 250 nm.
8. A display comprising the polarizing plate of claim 1.
9. The display according to claim 8 comprising an organic light emitting device.

* * * * *